July 6, 1965 P. R. SZASZ ETAL 3,192,844

MASK ALIGNMENT FIXTURE

Filed March 5, 1963 4 Sheets-Sheet 1

INVENTORS
PETER R. SZASZ
FREDERICK W. KULICKE, JR.
BY ALBERT SOFFA

Bilker & Mayerman
ATTORNEYS

MASK ALIGNMENT FIXTURE

Filed March 5, 1963 4 Sheets-Sheet 2

INVENTORS
PETER R. SZASZ
FREDERICK W. KULICKE, JR.
BY ALBERT SOFFA
Silber & Moyerman
ATTORNEYS July 6, 1965 P. R. SZASZ ETAL 3,192,844

MASK ALIGNMENT FIXTURE

Filed March 5, 1963

4 Sheets-Sheet 3

INVENTORS
PETER R. SZASZ
FREDERICK W. KULICKE, JR.
BY ALBERT SOFFA

Bilher & Mayerman

ATTORNEYS

MASK ALIGNMENT FIXTURE

Filed March 5, 1963 4 Sheets-Sheet 4

INVENTORS
PETER R. SZASZ
FREDERICK W. KULICKE, JR.
BY ALBERT SOFFA
Bilher & Moyerman
ATTORNEYS United States Patent Office 3,192,844

Patented July 6, 1965

3,192,844

MASK ALIGNMENT FIXTURE

Peter R. Szasz and Frederick W. Kulicke, Jr., Philadelphia, and Albert Soffa, Wynnewood, Pa., assignors to Kulicke and Soffa Manufacturing Company, Fort Washington, Pa., a corporation of Pennsylvania Filed Mar. 5, 1963, Ser. No. 262,981

18 Claims. (Cl. 95—73)

This invention relates to a mask alignment fixture, and more particularly relates to an alignment instrument system for precisely positioning glass masks with respect to semiconductor and microcircuit wafers preparatory to transferring patterns of geometric indicia on the masks to the wafer surfaces.

In the fabrication of transistor and microcircuit devices, it is frequently necessary to infuse a plurality of diverse conductive materials in minute defined areas through the surface of semiconductor wafers. As many as twenty or thirty separate indicia, in the form of stripes, dots, circles, horseshoes, and the like may be included within a surface pattern on a single wafer chip, each geometric marking possible having dimensional outlines of a few ten thousandths of an inch and perhaps spaced from the next adjacent indicia by the same dimensional magnitude. Usually, the indicia are of separate and distinct metals in order to give the final transistor or microelectronic circuit its desired characteristic, and the metals are generally vacuum-evaporated or diffused sequentially through high-detail masks formed by a photographic resist image. These wafer surface designs are known in the art as transistor or microcircuit "geometry."

Mass production of today has evolved a system of applying the individual chip or dice geometry upon a semiconductor wafer "slab" in a series of precisely oriented files and rows by special microphotographic techniques. After the total geometry has been incorporated upon the slab, it is sliced from the larger area of an inch or so into the individual dice chips of maybe .020 inch squares. Thus, for example, each metal must be accurately placed in the precise zone of each chip by a series of micro-photographic printings on photoresist layers, followed by etching of each pattern and respective diffusion.

Photographic methods employing lenses cannot be employed because image distortions resulting from lens aberration exceed the small tolerances for positioning. Furthermore, each pattern would be sequentially projected only after exacting alignment of the mask indicia upon the next preceding design application already on the wafer surface, an insoluble problem where a photosensitive film has been coated on the wafer surface.

Contact printing with a light sensitive coating (photo resist) from an optically flat master offers the best promise of freedom from distortion. However, even where the face of the wafer is placed in abutment with the indicia bearing face of the mask or master, painstaking alignment of the indicia already on the wafer with the new indicia to be superimposed thereon from the mask must be provided. This must be accomplished by relatively moving the two surfaces with respect to one another in X- and Y-directions but also about a polar axis as well. In addition, the surfaces which are to abut one another must be in parallel adjacently spaced planes during the alignment operations, and after the alignment of the geometric indicia has been completed by micromanipulation, there must be means to retain the precise alignment as the two are then urged into abutment.

It is therefore an object of this invention to provide a mask alignment fixture for rapidly and accurately positioning mask indicia with respect to semi-conductor wafers.

Another object of this invention is to construct a mask alignment system which can provide the optimum degree of resolution required to deliver high yields of transistor and microcircuit devices.

Another object of this invention is to provide a high-production mask alignment system wherein the contacting interfaces of the mask and the wafer will be parallel planes.

Still another object of this invention is to provide a mask alignment system for semiconductor wafers wherein the contact pressure between the mask and wafer is adjustable.

A further object of this invention is to provide a self-aligning surface-contacting system wherein compensation can be afforded for any variance or non-uniformity of wafer thickness.

Yet another object of this invention is to provide a mask alignment instrument wherein all motions are smooth and precise with zero backlash or play.

A still further object of this invention is to provide a mask alignment instrument wherein all slidable parts can be easily adjusted for zero tolerances and later adapted readily to be readjusted to compensate for clearances resulting from ordinary wear.

Other objects of this invention are to provide an improved device of the character described that is easily and economically produced, which is sturdy in construction, and which is highly efficient and effective in operation.

With the above and related objects in view, this invention consists of the details of construction and combination of parts as will be more fully understood from the following detailed description when read in conjunction with the following drawings in which.

Figure 1:
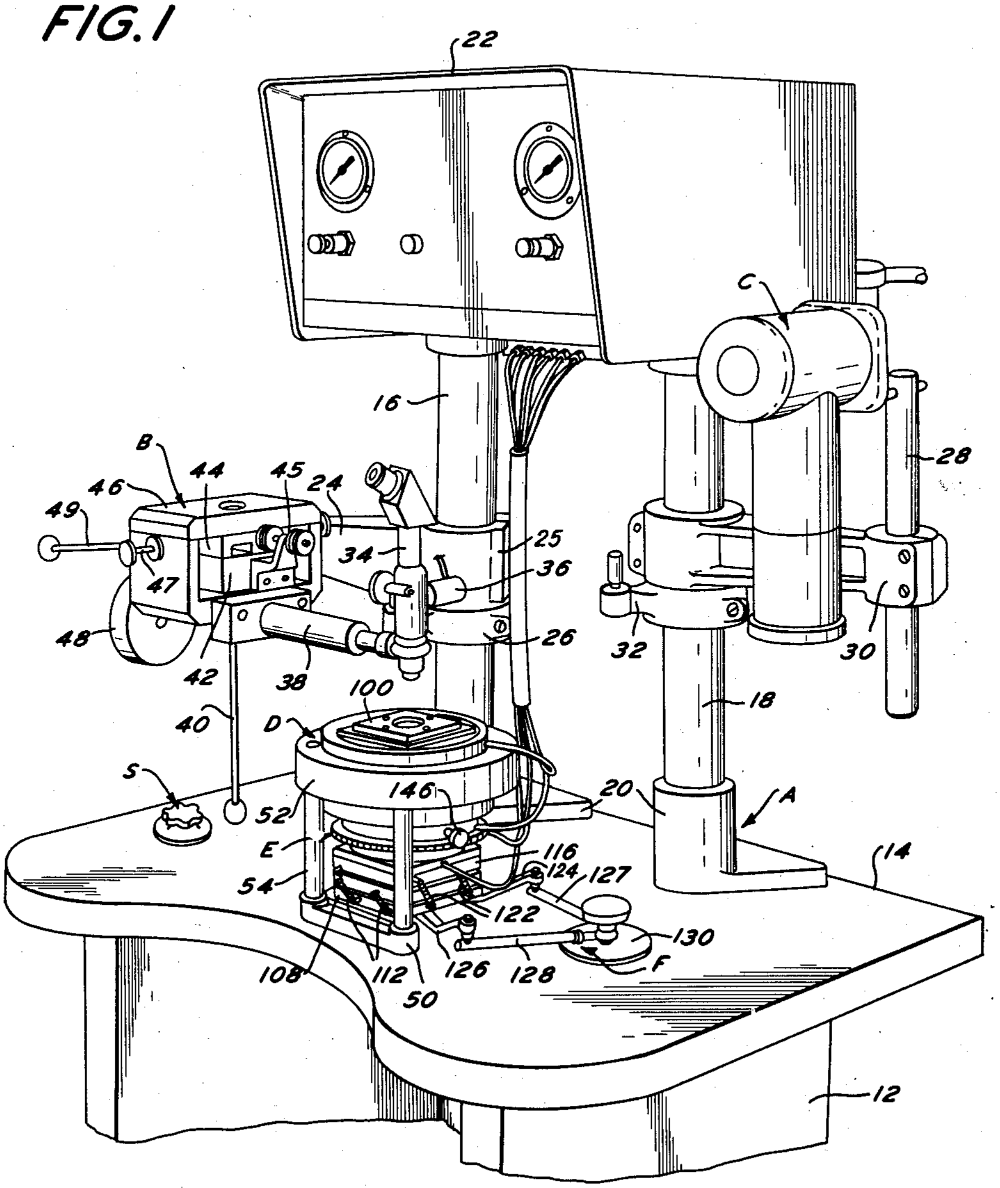
FIGURE 1 is a perspective view of a mask alignment instrument embodying this invention.

Referring now in greater detail to the drawing in which similar reference characters refer to similar parts, we show a mask alignment system comprising a primary frame, generally designated as A, a manipulatable microscope assembly, generally designated as B, an exposure light assembly C supported on said frame, a mask housing and chuck, generally designated as D, a wafer chuck assembly, generally designated as E, and a micromanipulator F for precisely orienting the wafer chuck E simultaneously about horizontal Z- and Y-axes with respect to indicia on a mask held in the chuck D.

The frame A comprises a base 12 having a smooth melamine-phenolic impregnated plastic surface or polished table top 14, as for example a plastic sheet sold under the registered trademark "Formica." As shown in FIGURE 1, a pair of posts 16 and 18 are respectively affixed to the rear of the table 14 by suitable brackets 20. Secured to the top of post 16 is a console module 22, which contains electrical and pneumatic controls, gauges and other components for proper operation of the system. The microscope and manipulator assembly B is also mounted upon the post 16 by a swinging arm 24 which sits upon stop collar 26. The exposure lamp C is coupled to vertical mounting rod 28 which is clamped in the outboard end of swinging arm 30, the latter being hingedly supported about post 18 on stop collar 32. The exposure lamp C preferably utilizes a mercury-vapor type bulb and is focused to provide a nearly parallel beam of light by appropriate adjustment of the lower shell portion thereof.

The assembly B includes a microscope 34 of the toolmaker type, approximately 100 power, which has a lamp 36 for illuminating the surfaces to be aligned. The microscope 34 is secured to manipulator assembly B by a mounting tube 38 and is adapted to be delicately positioned by joystick 40 in a horizontal plane simultaneously about X- and Y-axes for inspecting any point on the mask under the high power magnification. The manipulator B may be a micro-positioning device substantially similar to that fully shown and described in U.S. patent application, Serial No. 40,890, filed July 5, 1960, for an invention by Frederick W. Kulicke, Jr. in "Fine Wire Manipulator and Bonding Instrument for Transistors." In the instant disclosure, as generally illustrated in FIGURE 1, a base plate 42 is mounted upon the outboard end of swinging arm 24. A first stage 44 is laterally slidable upon the base plate 42 and is limited in its X-movement by adjustable stops 45 mounted on opposed ends of the base. A yoke 46 is similarly slidable in a Y-direction on the first stage 44 transverse to the movement of the first stage. Adjustable stops 47 threadedly secured in opposing sides of the yoke 46 are adapted to abut the first stage and limit the Y-motion of the microscope 34. The joystick 40 freely extends through the first stage 44 and is coupled by self-aligning or universal ball joints, such as "Heim" joints, to the base 42 and the upper portion of the yoke 46 respectively. In this manner, hand movement of the lower end of the joystick 40 will transmit a proportionally reduced movement in an opposite direction to the microscope 34, the inversion of manipulation being provided to accommodate for operator equilibration during observation of movement through a lens system. The stops 45 and 47 are used so that the operator can shift the microscope 34 rapidly from one reference position to another on the mask M without excessive manipulation in location of these positions. These position points are preselected in order to determine whether the X- and Y-positions, as well as the polar positions, of the indicia on the mask M with respect to those on the wafer W are in correct registration. Suitable counter weights 48 are hung from the yoke 46 to compensate for the oppositely cantilevered load of the microscope 34. A handle 49 extends from the swinging arm 24 in order to facilitate the swinging of the microscope 34 into and out of position with respect to the mask housing D. It is to be observed that the swinging arm 24 has a split clamp 25 which embraces the post 16, as shown in FIGURE 1, the split clamp being tightened up by conventional screws (not shown) in order to fix the arm 24 and the manipulator B with respect to the stop collar 26.

Figure 2:
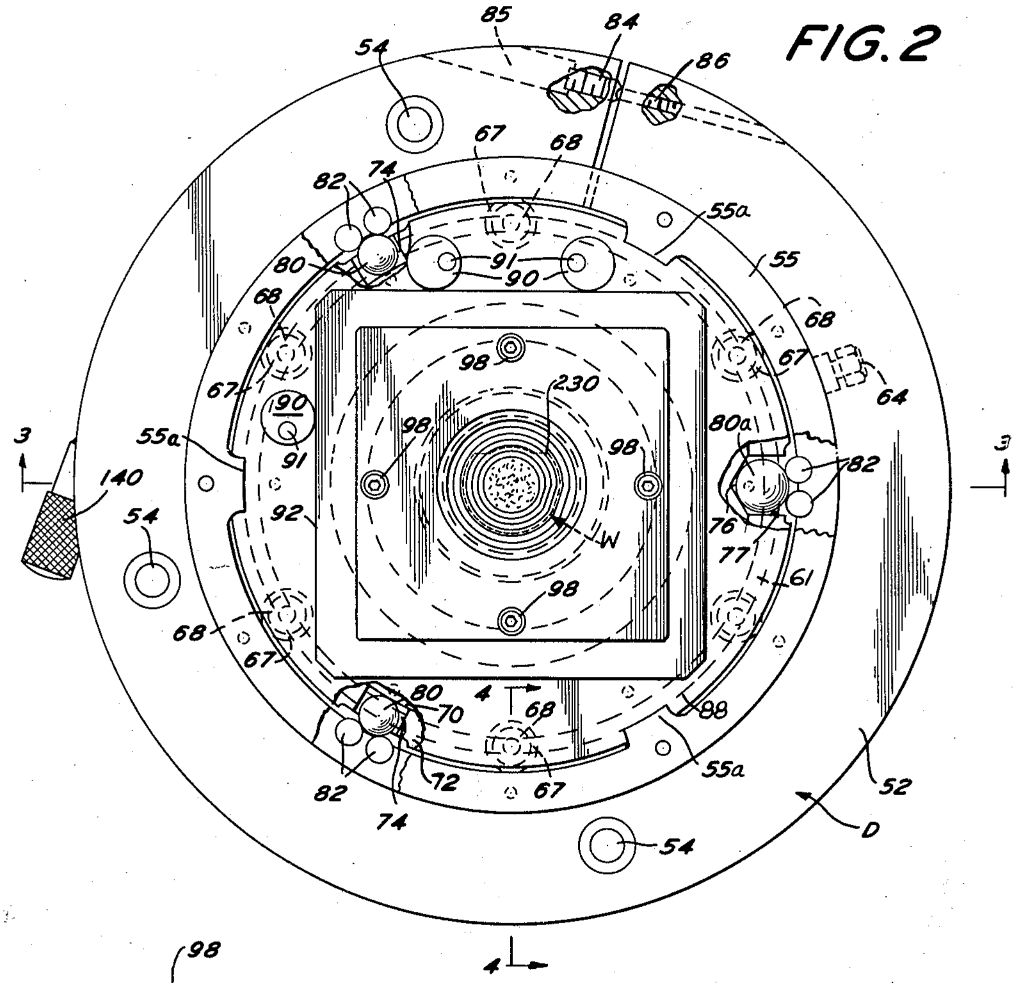
FIGURE 2 is a top plan view of the mask holding fixture with parts broken away.
Figure 4:
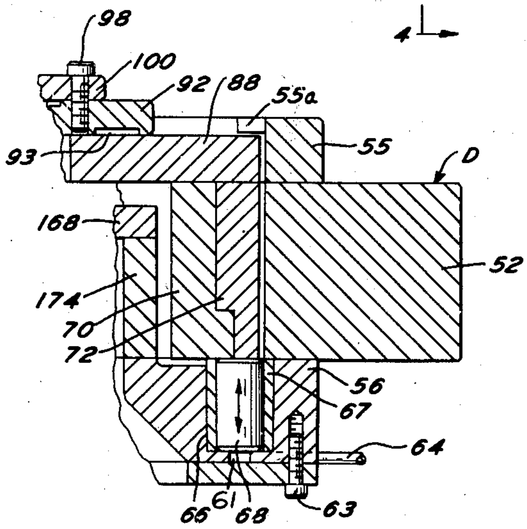
FIGURE 4 is a sectional view taken along lines 4—4 of FIGURE 2.

The mask housing assembly D includes a base casting 50 which is secured to the table top 14 by cap screws 51. A split-housing ring 52 is secured to and supported upon three columns 54 which are mounted in the base casting 50. The housing ring 52 is sandwiched between a limit stop ring 55 and an actuator ring 56 by three studs 58 which thread into tapped holes 53 in the stop ring 55 after extending through circumferentially-spaced registering openings in the housing ring and the actuator ring. A cover plate 60 is secured to the bottom of the actuator ring 56 by a plurality of concentric pairs of circumferentially-spaced socket screws 62 and 63 threaded therein and encapsulates a circular groove 61 in the actuator ring. A fitting 64 (see FIGS. 2 and 4) is threaded into actuator ring 56 and has a bore communicating with the circular recess 61, the fitting 64 being coupled to a source of air under 40 p.s.i. through a valve (not shown) in the module 22 which is electrically controlled by positioning of rotary selector selector switch S on the table top. A plurality of equally-spaced holes 66 are drilled through the actuator ring 56 on the radial centerline of the recess 61. These holes are reamed for a press-fit with bushings 67, the interior walls of which communicate with the circular recess 61 and act as cylinders for dowel pistons 68 slidably supported therein. When air under pressure is introduced into the circular recess 61 on demand of the selector switch S the pistons 68 are forced upwardly and drive inner race member 70 upwardly a predetermined distance to just release the mask M from contact with the wafer W as will be more fully described hereinafter.

The inner race member 70 is press fit within the inner wall of ball separator ring 72 and the two function as an integral unit which is slidably reciprocable vertically within the housing ring 52. The upper and lower surfaces of the ring-race member set 70–72 are ground and lapped to be flat and parallel within a few ten thousands total indicator reading. A V-grooved raceway 76 vertically extends in the periphery of the inner race member 70 and registers circumferentially with a circular aperture 77 radially drilled through the ball separator ring 72. Equilaterally spaced from the aperture 77 and from each other are a pair of circular apertures 74 which are also drilled radially through the wall of the ball separator ring 72. Dowel pins 78 pressed into and vertically projecting upwardly from actuator ring 56 freely pass through relieved openings in the ball separator ring 72 and extend partially into the respective apertures 74 and 77. A ball 80 is inserted within each of the circular apertures 74 and sits upon the corresponding dowel pin 78. The interior facing surface of the balls 80 bears against the outer periphery of the inner race 70. The exterior facing surface of each of the balls 80 bears against respective pairs of dowel guide rails 82 which are pressed within complementary lunular concavities in the housing ring 52 and project inwardly of the interior wall thereof. See FIGURE 2. A ball 80*a*, which is slightly larger in diameter than the balls 80 in order to compensate for the depth of the V-groove race 76, is inserted within the aperture 77 and also rests upon a dowel pin 78. The split-ring housing 52 is drawn about balls 80 and ball 80*a* by threadedly adjusting screw 84 through hole 85 with respect to cone point set screw 86 until the inner race 70 is vertically slidable within the housing ring 52 with minimum clearance but without binding. This provides a kinematic system in which straight up-and-down motion is restrained rotationally by ball 80*a* riding between the V-groove 76 and the guide rails 82. Triangularly complementing the ball 80*a* are the circumferentially-spaced balls 80 which roll between the outer periphery of the inner race member 70 and the respective guide rails 82 which define an outer race. This take-up bearing minimizes the tolerances of critically aligned parts and provides a "no-clearance" slide which can be equilibrated without binding during normal wear.

Secured to the upper surface of the vertically-reciprocable race unit 70–72 is a vacuum or mask hold-down plate 88. The opposing surfaces of the plate 88 are polished flat and parallel to the same tolerances as those of the inner race unit 70–72 and the upper face of the actuator ring 56. The horizontal surfaces of the limit stop ring 55 and the mask housing 52 are similarly lapped so that the under surface of lips 55*a* projecting inwardly of the stop ring itself define a reference surface against which the vacuum plate is adapted to abut. That is, there will be approximately one thousandth of an inch clearance between the bottom surface of the mask M and the upper surface of the wafer W when the air pressure actuated pistons 68 urge the race member 70 upwardly until the plate 88 is uniformly thrust against the lips 55*a* of limit stop ring 55.

Three eccentric mask stops 90 are adjustably held down upon the surface of the vacuum plate 88 by screws 91 to define a reference "square" for adjacent sides of mask frame bottom plate 92. The lower surface of frame plate 92 has a circular slot 93 therein which registers with a port 89 in the hold down plate 88. The port 89 is connected to a vacuum line 95 having a valve (not shown) in the module 22 actuated in positions 2 to 7 of selector switch S.

The upper and lower faces of the mask bottom 92 are ground and lapped parallel and flat as well as the rectangularly recessed medial portion. The center of the mask bottom 92 is circularly apertured and an O-ring 96 is supported concentrically thereabout in a complementary groove therein. A mask frame top 100 having a central circular aperture registering with that of the frame bottom 92 is clamped thereto by cap screws 98 with the mask M sandwiched therebetween. Since the mask M is usually a glass optical flat with the indicia on the lower surface, the lower face of the frame top 100 is also lapped and presses the mask resiliently against the O-ring 96 contained within the groove in the flat rectangular recess in the mask frame bottom 92. The rubber O-ring 96 acts as a cushion by elastically urging the sandwiched mask M against the frame top 100.

Figure 3:
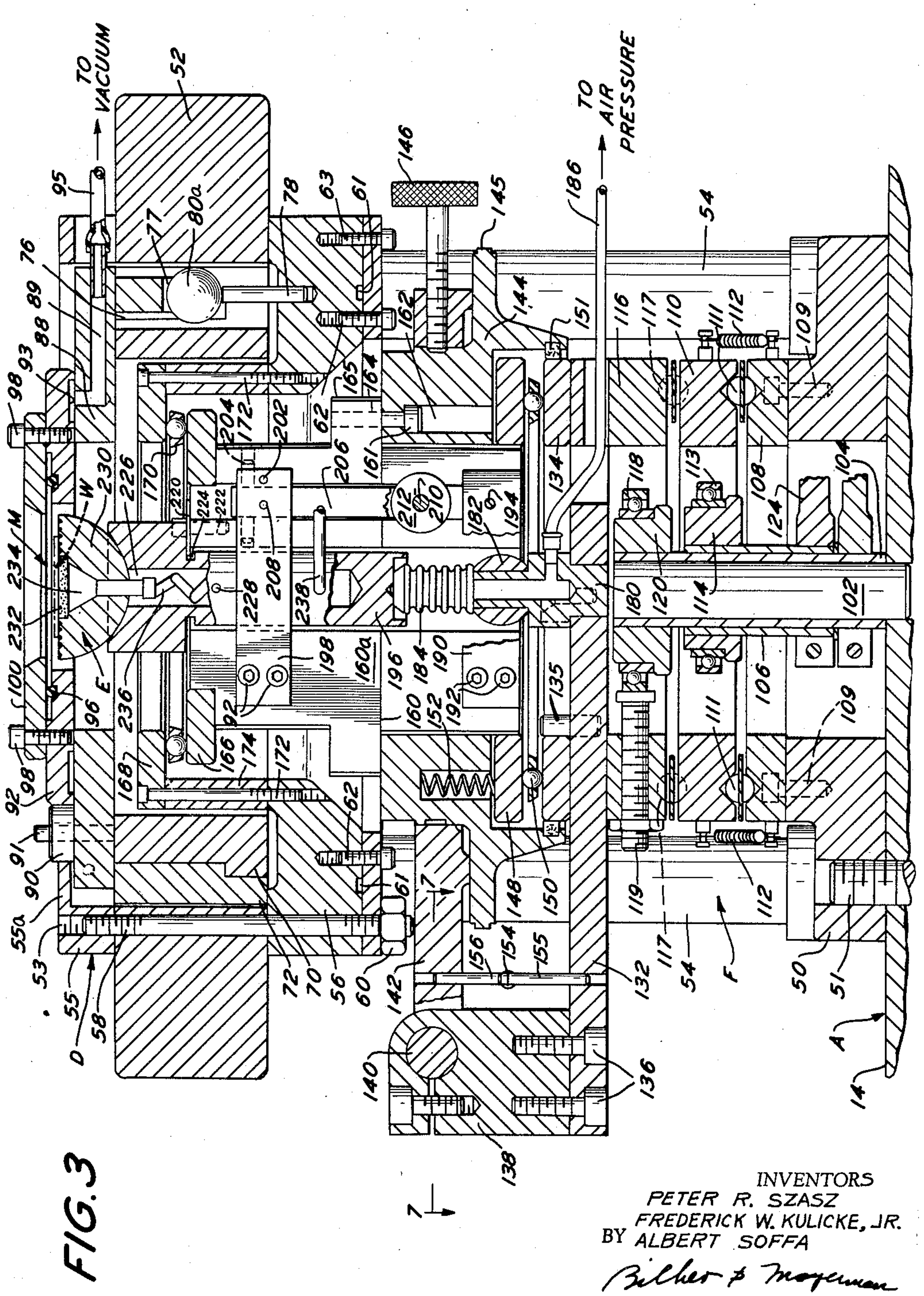
FIGURE 3 is a sectional view taken along lines 3—3 of FIGURE 2.

Referring now to FIGURES 1 and 3, it may be seen that the wafer chuck assembly E is supported upon the micromanipulator F which is adapted to orient the wafer W about horizontal X- and Y-axes with respect to the indicia in the mask M. The micromanipulator F is a positioning device fully described and shown in U.S. Patent No. 3,006,245, entitled "Pantograph Type Micro-Positioner." A central shaft 102 is vertically fixed within an aperture in the table top 14 and a pair of sleeves 104 and 106 are co-axially rotatable on the shaft and with respect to each other. A centrally-apertured base plate 108 is secured to the base casting 50 by screws 109. A first stage slider 110 is horizontally slidable on the base plate 108 in a plane perpendicular to that of FIGURE 3 and is resiliently held in gliding contact upon balls 111 sandwiched between complementary longitudinally-extending races by coil springs 112 which couple the first stage to the base plate. The first stage 110 is peripherally supported on a circular bearing 113 about an eccentric 114, the latter being affixed about the external sleeve 106. Thus, rotation of the sleeve 106 will cause the constrained first stage 110 to preferentially slide in or out of the plane of the paper as shown in FIGURE 3. A second stage 116 is slidable upon balls 117 which glide in complementary races transversely disposed to those in the base plate 108. The second stage 116 is peripherally supported on a bearing 118 by retaining screw 119 about an eccentric 120 affixed to the inner sleeve 104. Springs 122 bias the second stage 116 into face-to-face slidable contact with the first stage 110. Rotation of the sleeve 104 in a preferential direction thus causes the constrained second stage to slide right and/or left as shown in FIGURE 3.

Referring back to FIGURE 1 a linking arm 124 is clamped to the outer sleeve 106 and the inner sleeve is clamped to linking arm 126. The linking arm 124 is pivotally connected to pantograph rod 127 and the linking arm 126 is pivotally connected to a second pantograph rod 128. The outboard ends of the pantograph rods 127 and 128 are hingedly supported upon a "chessman" finger piece 130 which slidably sits upon the table top 14.

It is therefore easily seen that movement of the "chessman 130" about the surface of the table top 14 will transmit without backlash or play a proportionally reduced movement simultaneously along horizontal X- and Y-axes to a top plate 132 secured to the upper face of the second stage 116.

A thrust washer 134 is centrally disposed on the surface of top plate 132 by equilaterally spaced dowels 135 pressed within the top plate and bearing against the inner edge of the washer. Secured upon an offset of the top plate 132 by screws 136 is a bracket 138 into which is clamped a micrometer 140. The spindle of the micrometer 140 is adapted to abut against an offset projection of a ring adjustment arm 142 which is secured to the outer periphery of wafer head housing 144 and adjustably secured thereto by thumb screw 146. A second thrust washer 148 sits upon a ball thrust retainer 150 which is slidably supported on the upper face of the first thrust washer 134. A plurality of coil springs 152 mounted within respective radially-spaced counterbored holes in the head housing 144 resiliently support the head housing 144 upon the second thrust washer 148. A felt ring 151 is mounted in an internal circular groove in the head housing 144 and embraces the outer periphery of the first thrust washer 134. A coil spring 154 which is tensioned between hanger pin 155 upwardly extending from the top plate 152 and hanger pin 156 downwardly extending from the adjustment arm 142 biases the projection on the adjustment arm 142 into abutment with the spindle of the micrometer 140. Coarse polar adjustment of the ring 142 is accomplished by loosening the thumb screw 146 and rotating the head housing 144 by a knurled flange 145 thereon. Fine and precise polar adjustment of the ring arm 142 is accomplished by then tightening thumb screw 146 and finger rotation of the micrometer 140 barrel.

A ball alignment housing 160, having a cross section slightly greater than semi-circular, is pressed within the bore of head housing 144. The alignment housing is secured to the head housing 144 by socket head cap screws 161 which extend within radially-spaced counterbores 162 therein and threaded into tapped holes 164 in alignment housing flange 165. See FIGURES 3 and 5. The upper surface of the ball alignment housing 160 is annularly relieved to receive a thrust race 166. Sandwiched between the thrust race 166 and the thrust bearing race 168 is a ball retainer 170. The thrust bearing race 168 is secured to the actuator ring 56 by a plurality of circumferentially spaced screws 172 which threadedly engage tapped holes in the actuator ring after passing through bearing support ring 174. Thus, it is to be observed that the ball alignment housing 160 is resiliently supported upon a floating carriage defined by the encapsulated coil springs 152 which vertically and divergently urge the respective thrust washers 148 and 166 into slidable engagement with their corresponding thrust bearing races 134 and 168 through the sandwiched ball retainers 150 and 170. It is further apparent therefore that the ball alignment housing 160 is horizontally positionable along X- and Y-axes through micromanipulator F and polarly rotatable in precise configuration by micrometer 140 bearing against ring adjustment arm 142.

Figures 5, 6, 7:
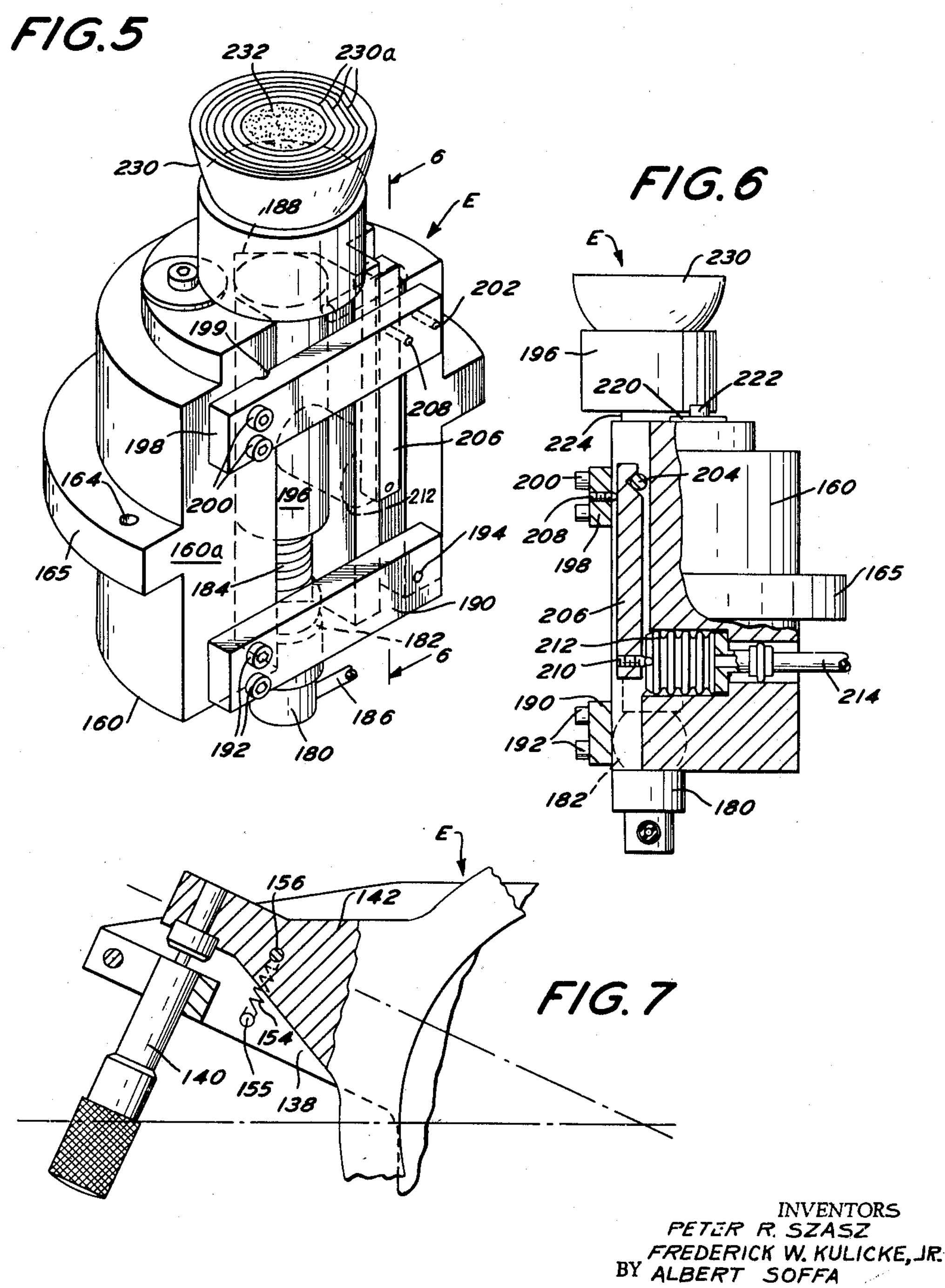
FIGURE 5 is a perspective view of a wafer chuck embodied in this invention.
FIGURE 6 is a sectional view taken along lines 6—6 of FIGURE 5.
FIGURE 7 is a fragmentary sectional view taken along lines 7—7 of FIGURE 3.

Referring now to FIGURES 3, 5, and 6, a ball locating pivot 180 is centrally secured within the micromanipulator top plate 132. An oblate ball 182 having an axial bore, for example, a "Heim" ball, is press fit upon the upper annularly reduced neck of the pivot 180. Secured within the bore of the pivot 180 and vertically extending upwardly therefrom is an air bellows 184 which is connected to the source of 40 p.s.i. air pressure through tubing 186 and a solenoid valve (not shown) actuated by selector switch S. The surface of ball 182 is embraced within a ground and polished V-slot 188 in alignment housing 160 by a spring plate 190. One end of spring 190 is secured flush against flat housing face 160*a* by screws 192 and the other end adjustably tensioned against the ball 182 by set screw 194 until the housing 160 will just rotate about the ball 182. In this manner, the rotational clearance of the housing 160 about the ball 182 can be reduced to a minimum and even later "zeroed out" with component wear.

Also slidably mounted in the lapped V-groove 188 of the ball alignment housing 160 is a wafer chuck support 196. The chuck support 196 is an accurately ground and polished cylindrical member which is embraced by spring plate 198. The spring plate 198 has a vertically extending groove 199 and is clamped to the face 160*a* by cap screws 200. The free end of the spring plate 198 has a set screw 202 which is threadedly adjusted into contact with the face 160*a* until the plate 198 clamps the chuck support 196 in non-slidable contact with the V-groove 188. Pivotally supported on dowel 204 pressed into housing 160 behind the spring clamp 198 is an actuating lever 206.

The front face of the lever 206 is in abutment with an oval head set screw 208. The lower end of the lever 206 has a cupped head set screw 210 which engages the conical point of air bellows 212. The air bellows 212 communicates through tubing 214 with the 40 p.s.i. air source by way of a valve (not shown) in the console 22 actuated electrically by selector switch S. The set screws 208 and 210 are so adjusted that the actuation of the bellows 212 will be just sufficient to flex the spring clamp 198 (approximately one millionth of an inch) to release the clamping of the cylindrical wafer chuck support 196. Therefore, when the bellows 212 is actuated, the mechanical advantage of the lever 206 bows the spring plate 198 enough to release the contact pressure against the mask chuck support 196 whereby it will fall or gravitationally rest upon the point of air bellows 184. Correspondingly, release of pressure of spring clamp 198 permits bellows 184 to drive the chuck support 196 upwardly so that the face of the wafer W can be urged into contact with the mask M. Lastly, locking of the contact pressure of spring clamp 198 enables the entire wafer chuck assembly E to be rotated about the Heim ball pivot 182 reference. It is thus easily seen that effectively, a "no-clearance" slide is provided by each of the spring plate clamps 190 and 198 about the corresponding ball 182 and chuck support cylinder 196, the contacting pressures of each being adjustable initially and also thereafter to take up play resulting from part wear. The relative clearances of each of these clamps between "lock" and "slide" is approximately one millionth of an inch without requiring machining to this accuracy.

A limit stop 220 which is fastened to the upper face of the alignment housing 160 by screw 222 engages an annular groove 224 in the chuck support cylinder 196 below the shoulder thereof. The total axial movement of the support cylinder 196 is thereby restricted to approximately .060 inch. The chuck support cylinder 196 has an axial bore 226 therein which communicates with the vacuum line through port 228 and a valve (not shown) also controlled by positioning the selector switch S.

The wafer chuck itself is a stainless steel hemi-spherical ball 230 having sintered stainless steel insert 232 pressed into a conical counterbore 234 therein. The insert 232 is porous and is ground and lapped flush with the flat surface of the chuck 230 after assembly. A plurality of concentric grooves 230*a* are etched in the flat chuck face. The spherical polished face of the chuck 230 is rotatably supported in a conically-ground and lapped seat at the upper interior portion of the support cylinder 196. A resilient coil or helix of tubing 236 is connected at one end within the bore of the chuck ball 230 and extends downwardly through the support bore 226 where the other end is connected to a vacuum fitting 238. The tubing 236 resiliently draws the chuck 230 into the seat so that the chuck is free to rotate and assume a self-orienting position when the wafer W, vacuum-held on the chuck face, is pressed into abutment with the bottom face of the mask M. The vacuum fitting 238 is connected to an exhaust line (not shown) through a valve (not shown) actuated, again, by the selector switch S. After the face of the chuck 230, with the wafer W retained thereon, has been oriented, vacuum is similarly applied to the port 228 (i.e. via selector switch S) so that the bore 226 is evacuated and the ball 230 retained in fixed locked position within its support seat. It is to be observed that by placing the wafer W upon the flat of the hemispherical chuck 230, the wafer is adjacent the center of rotation of a sphere. In this manner, there will be minimum scrubbing and lesser forces imposed upon the wafer during self-alignment of the chuck 230 when, for example, a non-parallel wafer is urged against the mask M.

In a manner well-known in the art, the contacts of the selector switch S are electrically coupled to respective solenoids and/or relays (not shown) which, when energized, function to actuate the various pneumatic valves in the console 22. The actuating positions of the selector switch S are arranged in a numerical order so that the alignment operations are performed in a logical sequence. The operating steps of the rotary switch positions correspond to the following system functions:

| Position | Function | System |
|---|---|---|
| #8 | OFF | No vacuum or air pressure supplied to any system component. |
| #1 | LOAD WAFER | Vacuum applied to wafer chuck surface 232 through tubing 236. |
| #2 | HOLD DOWN MASK | Vacuum applied to mask chuck 88 and port 89 through tubing 95. |
| #3 | ELEVATE WAFER CHUCK (Parallel Plane Alignment). | Air pressure applied to bellows 184 and bellows 212. Wafer upper surface pushed against mask bottom surface and chuck E is self-aligned. |
| #4 | LOCK WAFER CHUCK | Vacuum applied to ball joint through port 228 to lock wafer chuck in seat. Air pressure released from bellows 212 to lock spring clamp 198 against support 196. Air supply cut off to bellows 184. |
| #5 | ELEVATE MASK CHUCK (Registration alignment of wafer surface in a plane along X-, Y- and polar axes with respect to the mask indicia is now performed by manipulator F and micrometer 140.) | Air pressure supplied to cylinders 67 through fitting 64 to drive mask chuck 88 against stops 55*a* thereby spacing mask .001 inch above wafer surface. Wafer chuck remains locked. |
| #6 | DROP MASK CHUCK (Mask chuck is again depressed into contact with wafer which is still locked. Microscope is now swung out of the way and exposure lamp C swung into position over mask. Photosensitive wafer surface exposed to light for specified time.) | Air pressure to cylinders 67 released. |
| #7 | RETRACT WAFER CHUCK. | Air pressure applied to bellows 212 to release clamp 198. Air supply released to bellows 184 causing retraction thereof and lowering of wafer chuck. |
| #8 | OFF (Mask frame removed from mask chuck and wafer removed from wafer chuck preparatory to next sequence. | All vacuum and air pressure supplies released. |

As is apparent from the foregoing description, the adjustment and operation of the mask alignment system is as follows:

After preliminarily arranging the location of the exposure lamp C, adjusting the pressures of the vacuum and air pressure lines, and verifying by conventional optical procedures that the microscope 34 is perpendicular to the mask M mounted in its holder 90–100 as the latter is retained upon the mask hold-down plate 88, the rotary switch S is turned to position #8 and the mask frame 92 removed. It is to be noted that a common means for orienting the optical axis of the microscope 34 normal to the mask M is to utilize the depth of focus of the microscope over its field. That is, the depth of field of a 100 power toolmaker's microscope is approximately 3 or 4 mils. By angularly orienting the microscope 34 on its mounting bracket 38 until the entire field of the flat mask M, as observed through the eyepiece, is in focus, the perpendicular vertification is satisfied. Still another conventional optical system for verifying the degree of perpendicularity of the microscope optical axis with the surface of the mask M is to project an illuminated image of the microscope crosshairs upon the mask surface. Then, compare the position of the crosshair image reflected from the mask back upon the microscope focal plane with the crosshairs themselves.

A wafer W is now placed on the wafer chuck 230, the flat edge of the wafer being aligned with an orienting line thereon. The 8-position selector switch S is rotated to position #1 which actuates the valve which places a vacuum on the chuck disk 232 through coil tubing 236, thereby clamping wafer W. The mask holder with the mask M clamped resiliently between frame plates 92 and 100, is mounted upon mask chuck plate 88 against eccentric stops 90 or the mask holder is slidably turned thereon slightly to align the mask M with crosshairs in microscope 34. The selector switch S is turned to position #2, which additionally applies a vacuum to the chuck plate 88 through tubing 95 and thereby clamps the mask M in position thereon. The selector switch S is now turned to position #3 which actuates the bellows 184 causing the mask support cylinder 196 to be slidably urged upwardly until the wafer W is pressed into face-to-face contact with the bottom face of the mask M. Verify that the wafer W rises into contact with the mask M, the chuck ball 230 "finding" its seat within the support 196. The face of the wafer W is now in a plane-parallel relationship with the lower surface of the mask M. As described hereinbefore under "verifying the perpendicular orientation of the microscope," verification of the wafer-mask interfacial abutment may be accomplished by observing that the entire plane of the wafer surface is in focus as seen within the microscope field of view. A non-aligned wafer surface would be exhibited as an inability to focus at the edges of the field. In passing, it is believed worthwhile to mention that conventional optical interference principles may also be utilized to verify that the wafer surface is in parallel abutment with the mask surface. That is, since both the mask and the wafer surfaces are polished "optical flats," directing a beam of monochromatic light (sodium for example) at the interface would produce a series of interference rings or fringes therein. Parallel alignment would be demonstrated by symmetrical or concentric fringes while a wedge-shaped interface would be exhibited as a series of generally parallel spaced fringes.

The rotary switch S is now turned slowly through position #4 to position #5. The pistons 68 will be actuated by the supply of air under pressure through lines 64 and drive the mask chuck 88 upwardly against the ring limit stops 55*a*. There will now be approximately .001 inch clearance between the faces of the mask M and the wafer W. In position #4, the vacuum will be applied to port 228 and bore 226 so that the ball chuck 230 will be locked in position and the interface between the wafer and the mask will be planar. Simultaneously in position #4, air pressure on bellows 212 will be cut off so that lever 206 will exert no force against spring clamp plate 198. Therefore the spring plate 198 will now exert a positive force against the chuck support cylinder 196 and lock the wafer in fixed vertical position. Concurrently, air pressure will be discontinued to bellows 184 so that it will not exert an upward force upon support 196.

The wafer W may now be manipulated in a horizontal plane by positioning chessman 130 accordingly so that a point on the wafer will register precisely with a point of indicia on the mask M as seen through the microscope 34. A second point on the wafer is precisely oriented with a second point of the mask indicia after having moved the microscope horizontally to the point of second reference by way of joystick 40. Polar orientation of the wafer with respect to the mask indicia is accomplished by manipulation of the micrometer 140 against ring adjustment arm 142.

The rotary switch is then turned to position #6 which discontinues the air pressure to the cylinders 67 whereby the pistons 68 will retract so that the mask is lowered into abutment with the wafer. The microscope 34 is swung out of the way and the exposure lamp C rotated into position above the mask. The face of the wafer is exposed to the lamp for the required time, after which the lamp C is swung out of position. The rotary switch is turned through position #7 (RETRACT WAFER CHUCK) to position #8 (OFF) whereupon the mask frame may be released and lifted from the mask holder. In position #7, air pressure is again applied to bellows 212 through line 214 so that the spring clamp 198 unlocks the support 196. The air supply to bellows 184, previously cut off under step #4, is now bled to atmosphere, and the bellows 184 contracts with consequent depression of the wafer chuck E. Position #8 is an "OFF" position wherein all vacuum is removed from line 95 (mask chuck), line 238 (wafer chuck) and line 228 (ball joint lock), and in addition, air pressure to all lines released. The exposed wafer W may be lifted from the chuck 230 by a vacuum pick-up and the entire process repeated with subsequent wafers and additional masks.

Although this invention has been described in considerable detail, such description is intended as being illustrative rather than limiting, since the invention may be variously embodied, and the scope of the invention is to be determined as claimed.

What is claimed is:

1. An alignment fixture for orienting geometric indicia on a mask with respect to a semi-conductor wafer comprising mask holding means, wafer holding means, reciprocable means urging said mask holding means and said wafer holding means toward each other so that the wafer and the mask abut, self-aligning means constituting a universal joint in conjunction with said reciprocable means orienting the complementary abutting surfaces into a plane interface in order to compensate for variance in wafer thickness, second reciprocable means for separating said mask and wafer holding means while at the same time spacing apart the opposed surfaces of the mask and the wafer in adjacent parallel planes, and micro-manipulator means coupled with said wafer holding means and remotely positioned therefrom is for orienting the wafer along X- and Y-axes into precise registration with the mask indicia.

2. An alignment fixture for orienting geometric indicia on a mask with respect to a semi-conductor wafer comprising a frame, a mask chuck in said frame, a wafer chuck in said frame, manipulating means for orienting said wafer chuck in a plane with respect to said mask chuck, reciprocable means to urge said mask and wafer chucks toward each other so that opposing surfaces of the mask and wafer will abut, and orienting means constituting a universal joint in conjunction with said reciprocable means self-aligning the opposing surfaces upon abutment thereof into a common plane interface in order to compensate for variance in wafer thickness.

3. An alignment fixture for orienting indicia on a mask with respect to a semi-conductor wafer comprising a frame, a mask holder, a mask chuck slidably supporting said mask holder in a horizontal plane, vacuum means in said mask chuck retaining said mask holder in fixed position thereon, a wafer chuck in said frame reciprocable within said mask chuck, vacuum means in said wafer chuck retaining the wafer thereon, actuating means urging said wafer chuck toward said mask holder so that the wafer is pressed into abutment with the mask, and a universal joint on said wafer chuck actuated by the abutment of the wafer against the mask so that the corresponding opposed abutting surfaces thereof define an interfacial plane independent of variance in wafer thickness.

4. An alignment fixture for orienting indicia on a mask with respect to a semi-conductor wafer comprising a frame, a mask holder supported on said frame, a wafer chuck in said frame, reciprocable means in said frame and coupled with said chuck for advancing and retracting a surface of the wafer into and out of contact with a surface of the mask, a universal joint on said chuck self-aligning the opposed surface of the wafer as it is urged into contact with the mask, means to grossly position said mask holder simultaneously about X- and Y-axes with respect to said wafer chuck, and micro-manipulative means on said chuck for finely positioning the wafer simultaneously along X- and Y-axes with respect to the mask indicia into precise registration therewith.

5. An alignment fixture for orienting geometric indicia on a mask with respect to a semi-conductor wafer comprising a frame, a mask holder supported on said frame, a wafer chuck, piston means in said frame impelling said chuck toward said mask holder so that the wafer is urged into abutment with the mask, and self-aligning means constituting a universal joint on said chuck actuated by abutment of the wafer against the mask orienting the abutting surfaces thereof in a common plane interface independently of variance in wafer thickness.

6. An alignment fixture for precisely orienting indicia with respect to a surface comprising a frame holding means supporting the indicia in said frame, chuck means in said frame supporting a flat article therein, a housing having a longitudinally extending V-groove therein, a cylindrical member slidably disposed in the V-groove and supporting said chuck means, resilient means tangentially engaging said cylindrical member and orienting rotation thereof in the V-groove about a polar axis with respect to the indicia, means to slide said chuck means axially toward the indicia so that the article surface is in contact therewith, and means to lock said resilient means in frictional clamping engagement with said cylindrical member whereby said chuck means is restrained from axial and rotational movement to define a no-clearance rotational and longitudinally slidable fit.

7. An alignment fixture for precisely orienting indicia on a plane surface of a flat mask with respect to a plane surface on a semiconductor wafer comprising a frame, means for holding the mask in said frame, a chuck holding the wafer, reciprocable means in said frame and coupled with said chuck for advancing and retracting the wafer surface into and out of contact with the mask surface, and means on said chuck constituting a universal joint in conjunction with said reciprocable means whereby the opposed mask and wafer surfaces are self-aligned in abutting parallel planes when said reciprocable means is advanced.

8. The invention of claim 7 including means for locking the universal joint to affix the disposition of said chuck with respect to said reciprocable means so that the parallel planar relationship of the opposed mask and wafer surfaces is retained when said reciprocable means is retracted.

9. An alignment fixture for orienting indicia on a mask with respect to a plane surface comprising a mask chuck, a mask frame supported on said mask chuck, a wafer housing medially spaced within said mask chuck, means for precisely manipulating said wafer housing in a plane with respect to said mask chuck, means to precisely rotate said wafer housing about a polar axis with respect to said mask chuck, a chuck support axially slidable in said wafer housing, a hemi-spherical wafer chuck, universal joint means in said chuck support retaining said wafer chuck thereon, means to elevate said chuck support so that a wafer on the flat face of said wafer chuck will be urged into abutment with the mask in said frame and self-orient said wafer chuck in said universal joint means whereby a planar interface will be defined intermediate the abutting faces of said wafer and said mask, clamping means on said housing locking said chuck support in elevated position, means to lock said wafer chuck in the assumed position, and means to elevate said mask chuck a predetermined distance so that the mask will be spaced from the wafer with the surfaces thereof retained in parallel planes.

10. The invention of claim 9 wherein said mask chuck elevating means comprises an outer race, an inner race axially slidable in said outer race, an actuator ring, and reciprocable means in said actuator ring selectively engaging said inner race.

11. The invention of claim 10 wherein the upper elevation of said mask chuck is limited by a stop ring.

12. An alignment fixture for orientating indicia on a mask with respect to a semi-conductor wafer comprising a housing mask holding means detachably secured to said housing, a hemispherical wafer chuck holding the wafer centrally upon the flat portion thereof, a tubular member having a seat slidably supporting the spherical surface of said wafer chuck, means slidably supporting said tubular member in said housing, means to slide said tubular member axially toward said mask holding means so that the wafer and the mask abut whereby said chuck will self-align itself and orient the complementary abutting surfaces of the wafer and the mask into a plane interface with minimum scrubbing in order to compensate for variance in wafer thickness.

13. The invention of claim 12 including vacuum clamping means coupled with said tubular member to lock said wafer chuck within the seat of said tubular member.

14. An alignment fixture for orienting geometric indicia on a mask with respect to a semi-conductor wafer comprising a frame, a mask holding chuck supported in said frame, a wafer chuck supported in said frame below said mask holding chuck, means to manipulate said wafer chuck about X-, Y-, and polar axes in a horizontal plane with respect to said mask holding chuck, a coursing microscope, manipulating means supporting said microscope in said frame above said mask holding chuck for inspecting the relationship of the mask indicia with respect to the wafer indicia, means to swing said microscope out of position after the indicia has been placed into registration, and an exposure lamp hingedly supported in said frame above said mask holding chuck for light-exposing a light sensitive coating on the wafer through the mask.

15. In a mask alignment fixture, means to align a rotary member parallel with respect to a fixed reference surface comprising a base, a thrust race having a lower reference surface vertically spaced above said base and in fixed relationship therewith, a spherical ball affixed to and upwardly extending from said base, a wafer chuck housing intermediate said race and said base engirdling said ball and defining a rotary joint therewith, resilient means in said housing slidably bearing against said ball to take out clearance of said rotary joint, and spring means urging the upper portion of said wafer chuck housing into slidable engagement with the race reference surface whereby manipulation of said wafer chuck housing in a horizontal plane may be accomplished with minimum machining tolerances for parallelism in said wafer chuck housing.

16. An alignment fixture for orienting geometric indicia on a mask having parallel plane surfaces with respect to a semi-conductor wafer surface comprising a frame, a mask chuck holding the mask in said frame so that the surfaces of the mask are exposed, a wafer chuck holding a wafer in said frame so that one wafer surface is adjacently spaced from one of the mask surfaces, piston means to slide said mask and wafer chucks toward one another in a straight line and resiliently press opposed surfaces of the mask and the wafer into abutment with each other, universal joint means automatically orienting said mask and wafer chucks with respect to each other and collocating the opposed surfaces of the mask and wafer into a common plane interface as they are pressed together, means to slide said mask and wafer chucks apart in a straight line while maintaining said opposed mask and wafer surfaces in juxtaposed spaced apart parallel planes, and manipulating means in said frame for orienting the mask indicia in a plane about rectangular and polar axes with respect to the said wafer surface whereby a pattern of the indicia may accurately be disposed with respect to the wafer surface independently of variations in wafer thickness.

17. An alignment fixture for orienting geometric indicia on a mask with respect to a semi-conductor wafer comprising a frame, a mask chuck in said frame having a centrally disposed aperture therein, a holder supporting the mask in said chuck about the aperture, a wafer chuck, reciprocable means supporting said wafer chuck within the aperture, universal joint means coupling said wafer chuck with said reciprocable means, means to advance said reciprocable means and urge the wafer on said wafer chuck into abutment with the mask while said universal joint means self-aligns said wafer chuck so that the opposed abutting wafer and mask surfaces are oriented in a common interfacial plane, means to linearly separate said wafer chuck with respect to said mask and space the wafer from the mask while retaining the opposed surfaces thereof in adjacently spaced apart parallel planes, and manipulating means to orient said wafer chuck in a plane whereby the surface of the wafer may be brought into registration with the mask indicia.

18. The invention of claim 17 including means to drive said wafer and mask chucks toward one another while maintaining the opposing surfaces in registration so that the surfaces again abut, and means to transfer an image of the mask indicia to the wafer surface.

References Cited by the Examiner

UNITED STATES PATENTS

| | | | |
|---|---|---|---|
| 373,672 | 11/87 | McCarter | 269—249 |
| 669,282 | 3/01 | Lanpher | 269—249 X |
| 1,832,026 | 11/31 | Huebner | 95—73 |
| 2,863,705 | 12/58 | Gluchowicz | 308—6 |
| 3,090,288 | 5/63 | Wagner | 95—73 |
| 3,102,331 | 9/63 | Da Costa | 29—203 |
| 3,113,807 | 12/63 | Polidor | 308—6 |

EVON C. BLUNK, *Primary Examiner.*

R. H. EAVES, *Examiner.*